United States Patent [19]

Sakamoto et al.

[11] Patent Number: 5,349,197
[45] Date of Patent: Sep. 20, 1994

[54] METHOD FOR EXPOSING A PATTERN ON AN OBJECT BY A CHARGED PARTICLE BEAM

[75] Inventors: Kiichi Sakamoto; Hiroshi Yasuda, both of Kawasaki, Japan

[73] Assignee: Fujitsu Limited, Kawasaki, Japan

[21] Appl. No.: 953,073

[22] Filed: Sep. 29, 1992

[30] Foreign Application Priority Data

Sep. 30, 1991 [JP] Japan ................. 3-250847

[51] Int. Cl.$^5$ .......................................... H01J 37/302
[52] U.S. Cl. ........................... 250/492.22; 250/492.23
[58] Field of Search ........... 250/492.2, 492.22, 492.23, 250/398

[56] References Cited

U.S. PATENT DOCUMENTS

| | | | |
|---|---|---|---|
| 4,021,674 | 5/1977 | Koops | 250/492.23 |
| 4,213,053 | 7/1980 | Pfeiffer | 250/492.23 |
| 4,469,950 | 9/1984 | Taylor et al. | 250/492.23 |
| 5,051,556 | 9/1991 | Sakamoto et al. | 250/492.22 |
| 5,173,582 | 12/1992 | Sakamoto et al. | 250/492.22 |
| 5,175,435 | 12/1992 | Sakamoto et al. | 250/492.22 |

*Primary Examiner*—Bruce C. Anderson
*Attorney, Agent, or Firm*—Staas & Halsey

[57] ABSTRACT

A method for exposing a pattern of a semiconductor device on an object comprises the steps of extracting block exposure data from design data the semiconductor device, extracting variable exposure data from the design data, extracting fine exposure data from the variable exposure data such that the fine exposure data comprises exposure data for fine elemental patterns that have a size smaller than a predetermined threshold size below which exposure by a variable shaped beam is difficult, extracting mask data indicative of a construction of a beam shaping mask used for shaping the beam based upon the block exposure data, variable exposure data and the fine exposure data, such that the mask data includes information about location, size and shape of apertures formed on the beam shaping mask for shaping the beam, fabricating the beam shaping mask based upon the mask data, and exposing the device pattern by selectively passing the beam through one of the block apertures, the variable exposure aperture and the fine aperture based upon block exposure data, the variable exposure data and the fine exposure data.

16 Claims, 15 Drawing Sheets

FIG. 7

|  | (a) | (b) X | Y | (c) ΔX | ΔY |  |
|---|---|---|---|---|---|---|
| LINE 1 | 0000. | -100. | -100. | 5.0, | 2.6 |  |
| LINE 2 | 0000. | -100. | 0. | 2.5, | 4.5 | (1) VARIABLE EXPOSURE DATA |
| LINE 3 | 0000. | -100. | 100. | 1.8, | 0.08 | (a) PATTERN CODE |
| LINE 4 | 0000. | 100. | 100. | 1.8, | 0.8 | (b) ORIGIN COORDINATE |
| LINE 5 | 0000. | 0. | 200. | 4.8, | 0.08 | (c) PATTERN SIZE |
|  | 0000. | -350. | 10. | 2.0, | 1.0 | (2) VARIABLE EXPOSURE DATA |
|  | 0081. | -200. | -200. | 0, | 0 | (3) BLOCK EXPOSURE DATA |
|  |  |  |  |  |  | (a) BLOCK# |
|  |  |  |  |  |  | (b) ORIGIN COORDINATE |
|  |  |  |  |  |  | (c) NOT USED |

FIG. 8

MASK DATA

| (e) | (f) X | Y | (g) ΔX | ΔY | (h) |
|---|---|---|---|---|---|
| 0081, | 0 | 0 | 5.0, | 3.0, | 0001 |

FIG. 9

|  (a)  |  (b)  |  |  (c)  |  |  |
|---|---|---|---|---|---|
|  |  X  |  Y  |  ΔX  |  ΔY  |  |
| [LINE 3] | | | | | |
| 0 0 0 0, | −1 0 0, | 1 0 0, | 1. 8, | 0. 0 8 | VARIABLE EXPOSURE DATA |
| | ⇓ | | | ⇓ | |
| 0 0 8 4, | −1 0 0, | 1 0 0, | 1. 8, | 0 | VARIABLE LENGTH EXPOSURE DATA |
| [LINE 5] | | | | | |
| 0 0 0 0, | 0, | 2 0 0, | 4. 8, | 0. 0 8 | VARIABLE EXPOSURE DATA |
| | ⇓ | | | ⇓ | |
| 0 0 8 4, | 0, | 2 0 0, | 4. 0, | 0 | VARIABLE LENGTH EXPOSURE DATA |
| 0 0 8 4, | 4, | 2 0 0, | 0. 8, | 0 | VARIABLE LENGTH EXPOSURE DATA |

FIG. 10

MODIFIED MASK DATA

| (a) | (b) | | (c) | | (d) |
|---|---|---|---|---|---|
| 0 0 8 1, | 0 | 0 | 5. 0, | 3. 0, | 0 0 0 1 |
| ⋮ | ⋮ | ⋮ | ⋮ | ⋮ | ⋮ |
| 0 0 8 4, | 1 0 0, | 1 0 0, | 4. 0, | 0. 0 8, | 0 0 0 1 |
| ⋮ | ⋮ | ⋮ | ⋮ | ⋮ | ⋮ |

METHOD FOR EXPOSING A PATTERN ON AN OBJECT BY A CHARGED PARTICLE BEAM

BACKGROUND OF THE INVENTION

The present invention generally relates to fabrication of semiconductor devices, and more particularly to a method for exposing a semiconductor pattern on an object such as a semiconductor substrate by a charged particle beam.

In the fabrication of a submicron semiconductor device that has a pattern width typically in the order of 0.1 $\mu$m, the charged beam exposure system that uses a high energy charged particle beam such as an electron beam is essential. In the electron beam exposure system, the device pattern is exposed on the surface of a semiconductor wafer by a finely focused electron beam and one can easily achieve a pattern size of less than 0.05 $\mu$m with an alignment error of 0.02 $\mu$m or less. On the other hand, a drawback of such a charged particle beam exposure system is in that the throughput of exposure is limited because of the fact that the device pattern is written by a single stroke of the focused charged particle beam, in contrast to the conventional optical exposure system that exposes a large area of the substrate by a single shot of the optical radiation.

In order to overcome the foregoing problem, the inventor of the present invention has previously disclosed in U.S. Pat. No. 5,051,556, an electron beam exposure system that patterns the shape of the focused electron beam according to the elemental device patterns that form a part of the large and complex pattern of the semiconductor device. There, a mask called a block mask is provided in the electron beam exposure system in correspondence to optical path of the electron beam for shaping the electron beam upon passage therethrough, and the mask is provided with a plurality of apertures shaped according to the elemental device patterns. By deflecting the electron beam to hit one of these apertures, one can shape the electron beam according to the shape of the aperture and pattern having the shape of the selected aperture is on the surface of the wafer or substrate. By repeating the exposure of the elemental device patterns consecutively, one can obtain the desired large and complex pattern of the semiconductor device. Such a so-called block exposure system is particularly useful in the exposure process of device patterns that include a repetition of predetermined elemental device patterns, as in the case of semiconductor memories.

FIG. 1 shows the construction of the electron beam exposure system proposed previously by the inventors of the present invention.

Referring to FIG. 1, the electron beam exposure system includes an optical system 10 for carrying out the exposure by an electron beam and a control system 50 for controlling the exposure operation.

The optical system 10 includes an electron gun 14 that has a cathode electrode 11 for emitting thermal electrons, an anode electrode 13 for accelerating the electrons to form an electron beam and a grid electrode 12 for controlling the flow of the electrons from the cathode electrode 11 to the anode electrode 13. The electron beam produced by the electron gun propagates as a divergent beam generally in the direction of a target or object W, held on a movable stage 35.

The divergent electron beam thus produced is then passed through a shaping aperture formed in a plate 15 to have a desired cross section and directed to travel in coincidence with a predetermined optical axis O that extends from the cathode electrode 11 to the object W on which a pattern is to be written. Typically, the object W is a semiconductor substrate. In order to achieve the desired alignment of the electron beam with respect to the optical axis O, adjustment coils 36, 37, 38 and 39 are provided along the optical axis O.

The electron beam thus shaped by the aperture plate 15 is then focused on a point P1 located on the optical axis O by a first electron lens 16. A deflector 17, corresponding to the point P1, that deflects the electron beam in response to a control signal HS1 supplied, thereto that the electron beam hits a block mask to be such described later.

The electron beam is then received by a second electron lens 18 that has a focal point coincident with the point P1 and is converted to a parallel electron beam. This parallel electron beam is then passed through a block mask 20 on which a plurality of apertures for shaping the electron beam are formed. Upon passage through a selected aperture, it is possible to shape the electron beam such that the electron beam has a desired cross section.

In order to address the apertures on the block mask 20, a pair of deflectors 21 and 22 are provided above the mask 20 such that the parallel electron beam is initially deflected away from the optical axis O and then deflected back to travel in the direction parallel to the optical axis O. Further, in order to return the electron beam in coincidence with the optical axis O, another pair of deflectors 23 and 24 are provided below the mask 20. It should be noted that the deflectors 21–24 cause the foregoing deflection and hence the addressing of the selected aperture in response to deflection control signals PS1–PS4 that are supplied thereto.

The parallel electron beam thus returned to the optical axis O is then passed through a third electron lens 19 and focused at a point P2 located on the optical axis O. The electron beam is then passed through a demagnification optical system including a fourth electron lens 26 and another electron lens 29, and focused on the object wafer W by an objective lens 32. Thereby, the image of the selected aperture on the mask 20 is projected on the upper surface of the wafer W.

In the objective lens 32, various coils and deflectors such as a dynamic focusing coil 30 and a dynamic stig coil 31 are provided for focusing correction and astigmatic correction. Further, deflectors 33 and 34 deflect the focused electron beam on the object wafer W such that the electron beam moves over the object wafer W, wherein the deflector 33 causes movement of the beam spot within a maximum area of about 2 mm×2 mm, while the deflector 34 is used to deflect the electron beam within an area of about 100 $\mu$m×100 $\mu$m. Furthermore, a refocusing coil 28 for additional focusing control is provided above the electron lens 29.

In order to control the turning on and turning off of the electron beam on the object wafer W, a blanking aperture plate 27, provided between the fourth electron lens 26 and the fifth electron lens 29, which passes the electron beam through a blanking aperture 27a therein in coincidence with the optical axis O. The blanking aperture 27a has a reduced diameter and the blanking aperture plate 27 interrupts the electron beam when the electron beam is deflected away from the optical axis O.

Thereby, the electron beam disappears from the surface of the object wafer W.

In order to effect such a turning-on and turning-off of the electron beam, a blanking deflector 25, provided between the lens 19 and the blanking aperture plate 27, deflects the electron beam away from the optical axis O in response to a blanking control signal SB supplied thereto.

Next, the control system 50 for controlling the optical system 10 will be described.

Referring to FIG. 1 again, the control system 50 includes a magnetic storage device 51 that stores various design data of the semiconductor device or integrated circuit to be formed on the object wafer W and a CPU 52 that controls the optical system 10. The CPU reads the pattern information of the semiconductor device such as the pattern data, the positional data indicating the location on the wafer W on which the pattern data is to be written, the mask information indicating the array of the apertures on the block mask 20, etc. The pattern information and the mask information thus read out from the storage device 51 are transferred on the one hand to a data memory 54 and on the other hand to a sequence controller 62 via an interface circuit 53.

The data memory 54 stores the pattern information and the mask information and transfers the same to a pattern generator 55 that generates deflection control data PD1–PD4 in response to the pattern information and the mask information supplied thereto. The deflection control data PD1–PD4 are sent to a D/A converter 57 where they are converted to the analog deflection control signals PS1–PS4. Thereby, the selection of the apertures on the mask 20 is achieved as already described. The pattern generator 55 further produces positional data SD3 indicative of the location of the object wafer W on which the exposure is to be made. The data SD3 is sent to a D/A converter 65 where it is converted to an analog signal S3 that drives the sub-deflector 34 in the objective lens 32.

The pattern generator 55 further produces correction data HD indicative of the difference in the desired pattern and the selected pattern on the mask 20 and supplies the same to a D/A converter 56 where the data HD is converted to a control signal HS1 that drives the deflector 17. In response to the control signal HS1, the electron beam is moved over the block mask 20 and additional shaping is achieved by offsetting the electron beam slightly from the selected aperture. For example, the variable shaping of the electron beam is achieved by the deflector 17. Further, the deflector 17 achieves the deflection of the electron beam at high speed and in a limited area typically having a size of 500 μm×500 μm. The deflectors 21–24 are used, on the other hand, for the deflection of the electron beam for a relatively large area typically the size of about 5 mm×5 mm, though with reduced speed. Typically, the deflector 17 is constructed with an electrostatic deflector while the deflectors 21–24 are constructed with electromagnetic deflectors.

Additionally, the pattern generator 55 produces control data MKD for moving the block mask 20 and supplies the same to a mask drive mechanism 58. The mask drive mechanism 58 moves the mask 20 in response to the control data MKD in a plane substantially perpendicular to the optical axis O. Thereby, the entirety of the apertures on the mask 20 can be addressed by the electron beam by moving the mask 20 such that the specified aperture moves into the area where the addressing can be achieved by the deflection of the electron beam. Further, the pattern generator 55 produces a control signal for driving the refocusing coil 28 and supplies the same to the refocusing coil 28 via a D/A converter 70. Thereby, the proper focusing on the surface of the object wafer W is maintained even when the electron beam is deflected by the deflectors 33 and 34.

The pattern generator 55 produces a timing signal T for indicating execution of the exposure or waiting for the exposure. The timing signal T is supplied to a clock control circuit, or generator (CLOCK GEN) 59 that in turn produces blanking control data BC for indicating the interruption of the exposure. The data BC is then supplied to a blanking control circuit 60, and the blanking control circuit 60 drives the deflector 25 via a D/A converter 61 that produces the blanking control signal SB described previously. The clock generator 59 further produces a system clock, running at a predetermined rate, that determines the throughput of exposure as will be described in detail later.

The sequence controller 62 detects the timing information transferred thereto from the interface circuit 53 and indicating the commencement of the exposure process, and controls the data memory 54 via the pattern generator 55 to output main deflection data MD that is supplied to a deflection control circuit 63. The deflection control circuit 63 produces main deflection control data SD2 in response to the data MD supplied thereto and supplies the data SD2 to a D/A converter 64 where the data SD2 is converted to a deflection control signal S2. This deflection control signal S2 drives the main deflector 33 in the objective lens 32. Further, the deflection control circuit 63 controls a stage position correction circuit 68 in response to the activation thereof by the sequence controller 62, and the stage position correction circuit 68 drives the deflector 34 via the D/A converter 56 that produces the drive signal S3 as described previously.

In cooperation with the deflection control circuit 63 and the stage position correction circuit 68, the sequence controller 62 activates a stage moving mechanism 66 for moving the stage 35 while monitoring the position of the stage 35 by a laser interferometer 67. Thereby, the exposure of a selected pattern on the mask 20 is made at any desired location on the object wafer W.

FIG. 2 shows the construction of the mask 20.

Referring to FIG. 2, it will be noted that the mask 20 is provided with a number of pattern areas $E_1$–$E_9$ arranged in rows and columns and separated from each other by a pitch EL, wherein each pattern area may have a size of typically 5 mm×5 mm. Each area in turn includes a number of block areas $B_1$–$B_{36}$, arranged in rows and columns as shown in FIG. 3, wherein each block area is separated from each other by a pitch BL and includes therein an aperture for shaping the electron beam. Typically, each block area has a size of 500 μm×500 μm.

FIG. 4 shows an example of the shaping apertures formed in the block areas $B_a$–$B_d$ that are included in the foregoing block areas $B_1$–$B_{36}$, wherein it will be noted that the block areas $B_a$–$B_d$ contain apertures 20a–20g, wherein the pattern represented by these apertures require a plurality of shots when exposed by the rectangular beam. By deflecting the electron beam selectively by the deflectors 21–24, one can direct the electron beam to hit one of these block areas as indicated in FIG. 5, wherein the hatched region 71 represents the region illuminated by the deflected electron beam. In the illustrated example, the electron beam is shaped in accordance with the cross-shaped pattern corresponding to an aperture 72a. It will also be noted that FIG. 5 shows other block apertures such as apertures 72b–72d.

On the other hand, when it is necessary to write a pattern that is not included in the apertures on the mask 20, the electron beam 71 is directed to a large, generally square aperture 73a as indicated also in FIG. 5. Thereby adjusting the overlap of the electron beam 71 with the aperture 73a, one can produce a shaped electron beam having a desired cross section. This process is known as the variable beam shaping. Such a variable beam shaping is used for exposing those patterns of which frequency of exposure is low and hence not provided on the mask 20 in the form of the shaping aperture.

When the variable beam shaping process is applied to the electron beam to produce a very fine, elongated beam shape with a pattern width of less than 0.1 $\mu$m in the electron beam exposure process of FIG. 2, there arises a problem of decrease in the throughput of exposure. It should be noted a very high precision for the deflection of the electron beam is required to produce such a very fine beam shape, while such a high precision deflection requires a high precision D/A converter 57 for activating the deflectors 21–24. Associated with the use of the high precision D/A converter 57, the time needed for converting the deflection data PD1–PD4 to the corresponding analog signals PS1–PS4 increases substantially.

Further, it should be noted that such a variable beam shaping process, as applied to produce such a very fine elongated electron beam shape, causes a problem in that, while one of the elongated or principal edges of the beam thus obtained is shaped at the aperture 73a of FIG. 5, the other elongated beam edge is shaped by the shaping aperture provided in the aperture plate 15 of FIG. 1. Thereby, the focusing state of the electron beam may be different between the first principal edge and the second principal edge when the focusing action of the electron lens deviates from an ideal state. Further, because of the fact that the mask 20 interrupts most of the electron beam at the variable shaping aperture 73a, there is a tendency for a carbon deposit to accumulate on the upper major surface of the mask 20 during the operation of the system. As such a deposit of carbon accumulates asymmetrically on the one side of the aperture 73a that is illuminated by the electron beam, such a deposition modifies the distribution of the electric field in the vicinity of the variable shaping aperture and causes an unwanted distortion of the shaped electron beam. It should be noted that such a minute distortion of the beam shape can become detrimental to the device to be fabricated, particularly when the pattern to be exposed corresponds to a critical area of the device such as a gate region of a high speed MOS transistor or HEMT.

SUMMARY OF THE INVENTION

Accordingly, it is a general object of the present invention to provide a novel and useful method for exposing a pattern on an object, wherein the foregoing problems are eliminated.

Another and more specific object of the present invention is to provide a process for exposing a pattern on an object by a charged particle beam, wherein the process of the present invention enables the shaping of the charged particle beam to have an elongated beam cross section with a width smaller than a threshold value below which the variable shaping of the electron beam has been conventionally difficult.

Another object of the present invention is to provide a process for exposing a device pattern on an object by a shaped beam of charged particles based upon design data that represents said device pattern to be exposed, said device pattern being formed of a plurality of elemental patterns, comprising the steps of: extracting block exposure data from said design data such that said block exposure data comprises exposure data for those elemental patterns that are exposed repeatedly (i.e., a plurality of times); extracting variable exposure data from said design data such that said variable exposure data comprises exposure data for those elemental patterns other than said elemental patterns that are exposed repeatedly; extracting fine exposure data from said variable exposure data such that said fine exposure data comprises exposure data for fine elemental patterns that have a size smaller than a predetermined threshold size at which exposure of a pattern by a variable shaped beam is difficult, said variable shaped beam being formed by shaping a beam of charged particles at two intersecting edges of an aperture formed in a beam shaping mask while adjusting an overlapping of said beam and said aperture; extracting mask data indicative of a construction of a beam shaping mask used for shaping said beam of charged particles based upon said block exposure data, said variable exposure data and said fine exposure data, said mask data including information about location, size and shape of apertures formed on said beam shaping mask for shaping said beam of charged particles; fabricating a beam shaping mask based upon said mask data; and exposing said device pattern by selectively passing said beam through one of said block apertures, said variable exposure aperture and a fine aperture, based upon said block exposure data, said variable exposure data and said fine exposure data. According to the present invention, the charged particle beam can be shaped to have a size smaller than a threshold below which the shaping of the charged particle beam by the conventional variable beam shaping process has been difficult, by passing the charged particle beam through the fine aperture that is formed in correspondence to the fine exposure data, which in turn is extracted from the variable exposure data.

Other objects and further features of the present invention will become apparent from the following detailed description when read in conjunction with the attached drawings.

BRIEF DESCRIPTION OF THE DRAWINGS

FIG. 7 is a diagram showing an example of extracting block exposure data for the block exposure process and variable exposure data for the variable shaped beam exposure process from design data of a semiconductor device;

FIG. 8 is a diagram showing an example of mask data produced in the process of FIG. 6;

FIG. 9 is a diagram showing an example for extracting line exposure data that forms an essential part of the present invention, from the variable exposure data;

FIG. 10 is a diagram showing an example of mask data that is obtained by modifying the mask data of FIG. 8;

DETAILED DESCRIPTION OF THE PREFERRED EMBODIMENTS

Figure 6:
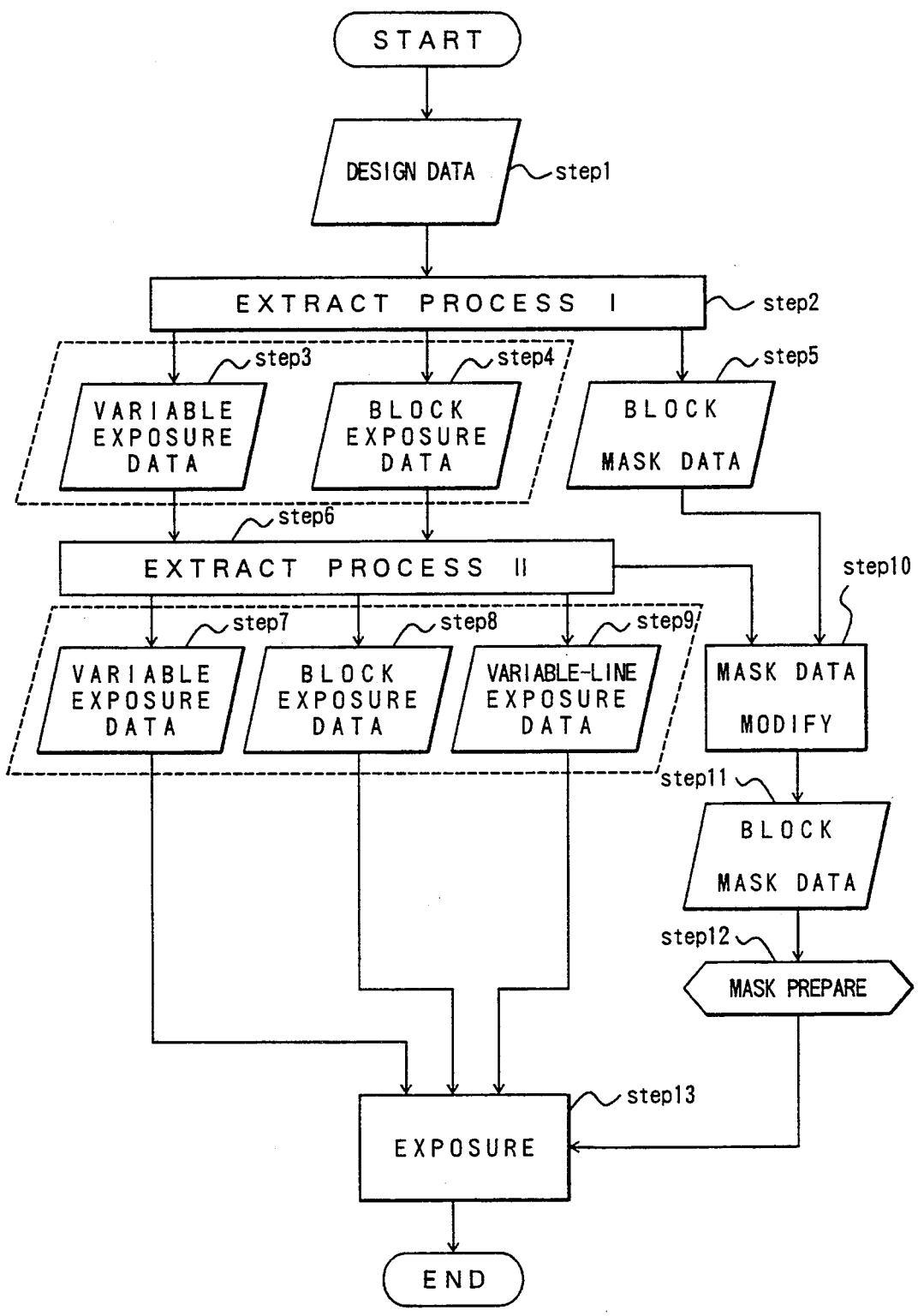
FIG. 6 is a flowchart showing the process for exposing a device pattern by the system of FIG. 1 according to a first embodiment of the present invention.

Hereinafter, the present invention will be described with reference to drawings starting from FIG. 6, wherein FIG. 6 is a flowchart for exposing a device pattern of a semiconductor device according to a first embodiment of the present invention.

Figure 1:
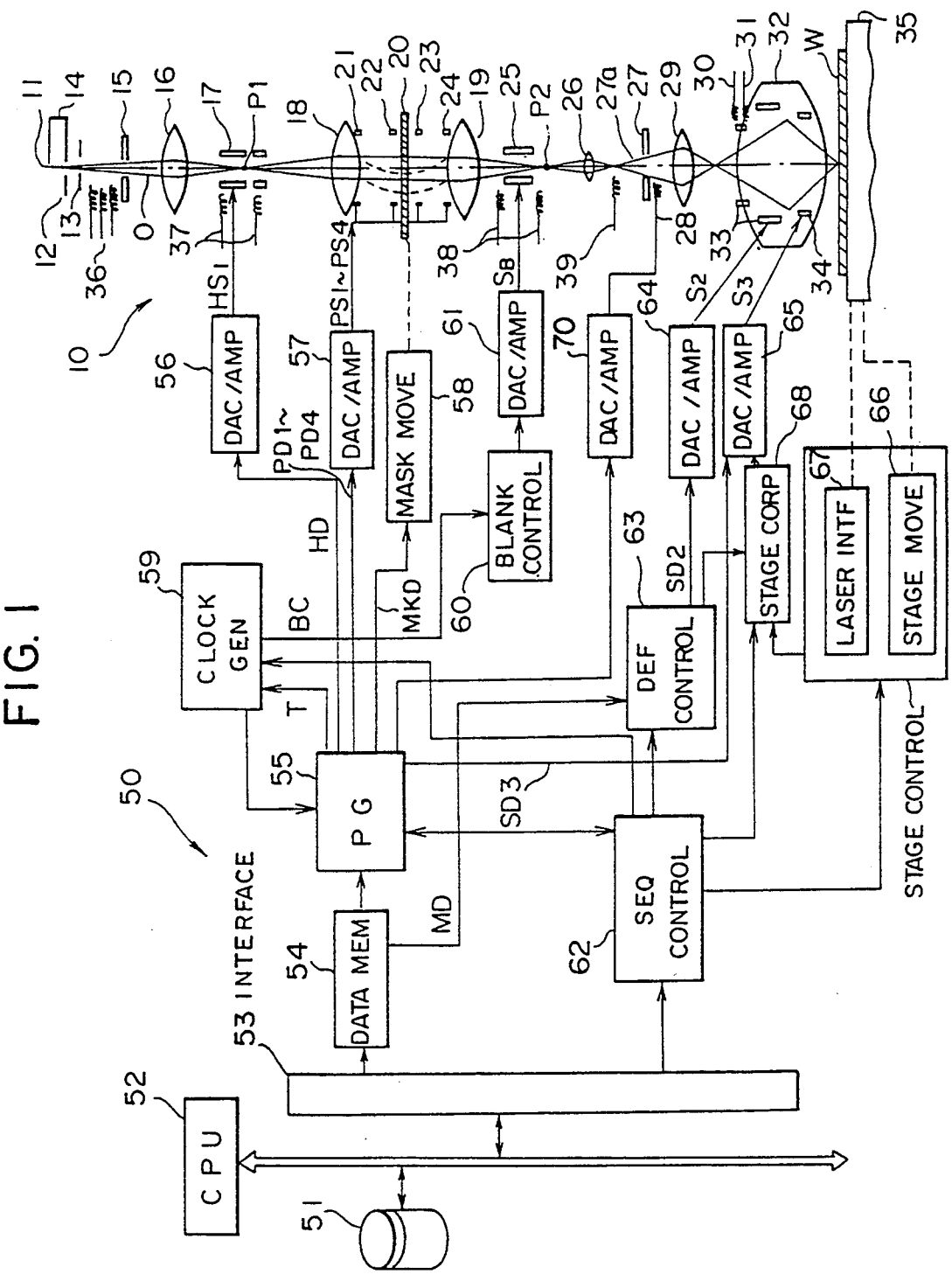
FIG. 1 is a block diagram showing the construction of an electron beam exposure system to which the present invention is applicable.

Referring to FIG. 6, the design data of a semiconductor device, is read out from a memory device such as the disk 51 of FIG. 1 by the CPU 52 in a step 1, wherein an example of the design data is shown in FIG. 7. Thus, the construction and format of the design data used in the present embodiment will be explained briefly, before going into the description of the process of the flowchart of FIG. 6.

Referring to FIG. 7, the design data is provided in the form of a combination of variable exposure data for the variable shaped beam exposure process and block exposure data for the block exposure process. In the example of FIG. 7 which actually corresponds to the data obtained in the steps 3 and 4 of FIG. 6, the variable exposure data and the block exposure data are separated from each other, while in the data obtained in the step 1, the design data is given in the form of a mere combination of these exposure data as noted above. It will be noted that each of the variable exposure data and the block exposure data uses at least three fields for the description of the data, the first field (a), the second field (b) and the third field (c). There, the variable exposure data and the block exposure data are distinguished from each other by the value of the third field (c) as will be described later.

In the variable exposure data, the first field (a) is used for the pattern code that specifies the shape of the pattern to be exposed by the variable shaped beam exposure process. In the illustrated example, the field (a) takes a value of "0000" in correspondence to an elongated rectangular pattern of variable size and extending in the X-direction. Further, the second field (b) is used for describing the X- and Y-coordinates of the origin of the pattern on the substrate, while the third field (c) is used for specifying the size of the pattern in the respective directions. For example, the second line of FIG. 7 specifies an exposure of a pattern having the shape given by the code "0000" of the field (a) on a substrate with a size of 2.5 µm in the X-direction and 4.5 µm in the Y-direction as specified in the field (c), starting from an origin at −100 µm for the X-coordinate and 0 µm for the Y-coordinate as specified in the field (b).

In the block exposure data, on the other hand, the field (a) carries a value indicative of the block number and is used to specify a block that is formed on the mask 20. In the illustrated example, a value of "0081" is entered. The second field (b) of the block exposure data is used for specifying the origin coordinates of the exposed pattern similarly to the second field (b) of the variable exposure data, while the third field (c) is unused. Thus, by inspecting the value of the third field (c), one can distinguish whether the data is the variable exposure data or the block exposure data. In the block exposure, the irradiation of the electron beam is achieved on the entire surface of the block area and the specification for the size of the pattern is not necessary.

The data of FIG. 7 is obtained by dividing the device pattern to be exposed into a number of meshes each having a size corresponding to the size of the block such as 5 µm×5 µm, wherein the extraction of the block exposure data is achieved by counting up the frequency of use for each of the patterns obtained as a result of the foregoing division into the meshes and by selecting those patterns that are used frequently, starting from the pattern with the maximum frequency of use.

Based upon the design data as shown in FIG. 7, a first extraction process is conducted in a step 2 as shown in FIG. 6, wherein the variable exposure data and the block exposure data are separated from each other respectively in steps 3 and 4, and mask data for specifying the size and coordinate of apertures to be formed on the mask 20 is produced in a step 5. There, the steps 3, 4 and 5 are not necessarily performed in any particular order but may be achieved concurrently, for example.

FIG. 8 shows an example of the mask data that is produced in the step 5 based upon the design data of FIG. 7 as a result of the process of the step 2.

Figure 2:
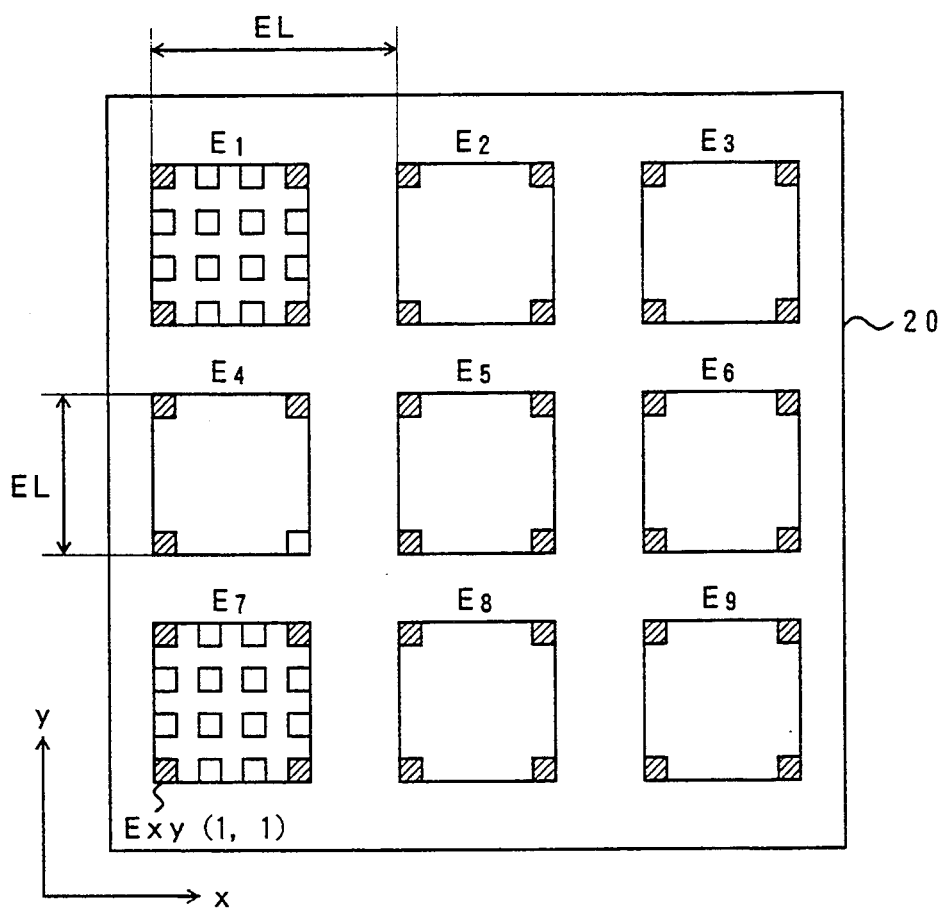
FIG. 2 is a diagram showing the construction of a block mask used in the system of FIG. 1 for shaping an electron beam.
Figure 3:
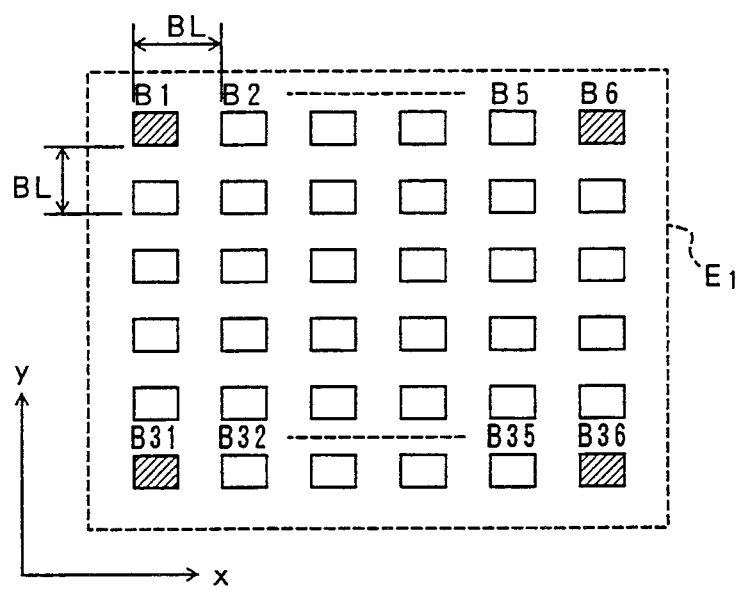
FIG. 3 is a diagram showing the construction of a pattern area that is formed in the block mask of FIG. 2 for carrying a number of pattern blocks.
Figure 4:
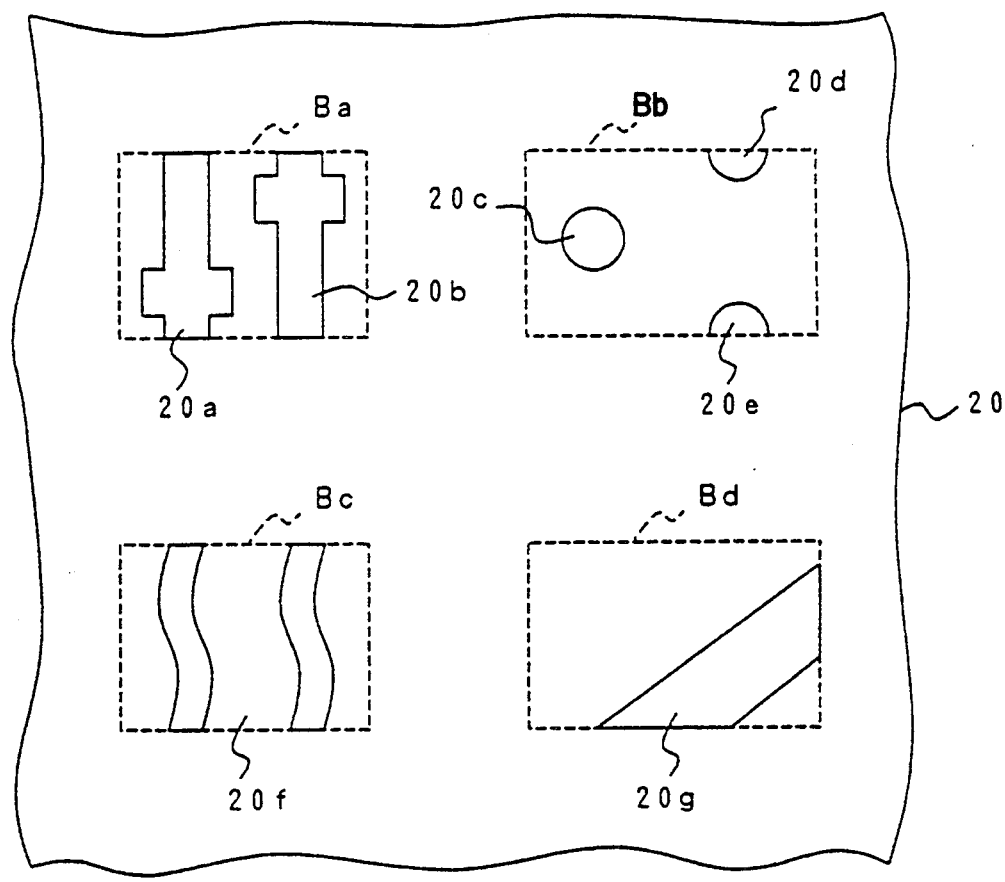
FIG. 4 is a diagram showing an example of apertures that are formed in the pattern block shown in FIG. 3.

Referring to FIG. 8, the mask data includes four fields (e)–(h), wherein the first field (e) is used to hold the block number corresponding to the data in the field (a) of the design data, while the second field (f) is used to hold the coordinates of the origin of the block area on the mask such as the block area $B_i$ (i=1, 2, . . . ) shown in FIG. 3. Further, the third field (g) is used to hold the data specifying the size of the aperture to be formed on the block mask, while the fourth field (h) holds the data specifying the pattern area $E_i$ (i=1, 2, . . . , see FIG. 2) in which the block area $B_i$ is included. In the illustrated example, the aperture designated by the code 0081 has a size of 5.0 µm×3.0 µm and formed in the block area having an origin at X=0 µm and Y=0 µm. Of course, the foregoing value for the size of the aperture represents the size of the beam that is projected on the surface of the substrate after demagnification by the exposure system of FIG. 1 and does not represent the real dimension of the aperture that is formed on the mask. In the actual exposure operation, the addressing of the block area $B_j$ by the electron beam is usually achieved within a single pattern area $E_i$. Thus, the same data is given in the field (h) for those block areas that are formed in the same pattern area $E_i$.

After the variable exposure data, the block exposure data and the mask data are extracted in the steps 3–5, a step 6 is performed wherein the variable exposure data is processed to extract data representing a very fine line pattern with a predetermined line width which is set smaller than a threshold size in any of the X- and Y-directions, wherein the foregoing threshold size is defined as a threshold below which the exposure of the pattern is difficult to achieve by the conventional variable shaped beam exposure process because of the instability of the electron beam as discussed previously with reference to the prior art. Typically, the threshold size is about 0.1 $\mu$m. In the illustrated example, it should be noted that the foregoing predetermined pattern width is set to 0.08 $\mu$m in correspondence to the critical device parameter such as the gate length of a HEMT to be fabricated. Of course, the predetermined pattern size is not limited to 0.08 $\mu$m but may be set to other values depending on the critical device parameter.

When the variable exposure data for the very fine line patterns having widths of 0.08 $\mu$m such as the data at the third and fifth lines of FIG. 7 are extracted in the step 6, the same is converted to variable line-length exposure data in a next step 9, and the original variable exposure data of step 3 is modified simultaneously to delete therefrom the exposure data that has been converted to the variable line-length data in step 7. On the other hand, the block exposure data remains unchanged in the present embodiment, as shown in a step 8. Further, simultaneously to the extracting of the variable line-length data, the mask data produced previously in the step 5 is modified to incorporate therein the slit pattern having the foregoing width of 0.08 $\mu$m and a suitable length set for example to 4.0 $\mu$m. Thereby, modified mask data is produced in a step 11, and the mask data thus produced is used to fabricate a block mask in a step 12 such that the mask has a construction similar to the block mask 20, except that a slit pattern is formed with the foregoing width of 0.08 $\mu$m and the foregoing length of 4.0 $\mu$m. The step 12 includes the usual photolithographic process applied to the material that forms the mask such as silicon. Further, exposure is achieved by using the mask thus prepared in the electron beam exposure system of FIG. 1 while controlling the electron beam exposure system by the exposure data obtained in the steps 7–9.

Next, the process for converting the variable exposure data to the variable line-length data will be described in more detail with reference to FIG. 9, wherein FIG. 9 shows two examples, the first one for converting the data at the third line of FIG. 7 to the variable line-length exposure data and the other one for converting the data at the fifth line of FIG. 7. It should be noted that the data in FIG. 9 is obtained as a result of the processes in the steps 7–9 of FIG. 6.

Referring to FIG. 9, it will be noted that the variable line-length exposure data that has been converted from the data at the third line of FIG. 7 carries a pattern code of 0084 in the first field (a) in correspondence to the variable line-length beam shaping, while the second field (b) of the same exposure data carries the origin coordinate data that is identical with the origin coordinate data of the original variable exposure data. Further, the field (c) carries the pattern size data corresponding to the pattern size data of the original variable exposure data except that the pattern size data "0.08" for specifying the width of the line data is dropped, as this parameter is no longer necessary for the exposure as long as the mask that is prepared by the process in the step 12 and containing the slit having the width of 0.08 $\mu$m is used for the exposure. In other words, the field (c) includes only the length data of the pattern to be exposed. In the present exposure data converted from the data at the third line of FIG. 7, the length of 1.8 $\mu$m is specified.

In the case of the data converted from the fifth line, on the other hand, it will be noted that the length of the line exceeds the length of the slit on the mask that is set to 4.0 $\mu$m in the present example. In such a case, the variable line-length exposure data is divided into two data parts, the first part having the length value of 4.0 $\mu$m in the field (c) and the second part having the length value of 0.8 $\mu$m in the field (c), and the exposure of the pattern is achieved by conducting the exposure of the first part and the second part consecutively. In order to obtain a continuous pattern having the total size of 4.8 $\mu$m on the substrate as a result of the foregoing two consecutive exposures or "shots," the origin of the second part data, described in the field (b) of the second part, is displaced in the X-direction by 4 $\mu$m with respect to the origin of the pattern located at X=0 $\mu$m and Y=200 $\mu$m. A similar extracting process can be achieved for the line patterns having other line widths such as 0.5 $\mu$m.

It should be noted that, as a result of the foregoing second extracting process in the step 6, one also obtains mask data for a mask that contains one or more slits for shaping the very fine line patterns by the variable line-length exposure process.

FIG. 10 shows an example of the mask data that is modified in accordance with the process of the step 6. Referring to FIG. 10, the data for the pattern designated by the code 0084 is added the data shown in FIG. 8. There, the pattern having the code 0084 has a length of 4.0 $\mu$m and a width of 0.08 $\mu$m, in correspondence to the exposure data shown in FIG. 9. Based upon the data shown in FIG. 10, a block mask is prepared in the step 12 including the apertures corresponding to the pattern 0084. By adjusting the overlap of the electron beam with respect to the block area in which the pattern 0084 is formed, one can expose a very thin stripe pattern having the width of 0.08 $\mu$m with an arbitrary length as long as the length is smaller than 4.0 $\mu$m.

Figure 11:
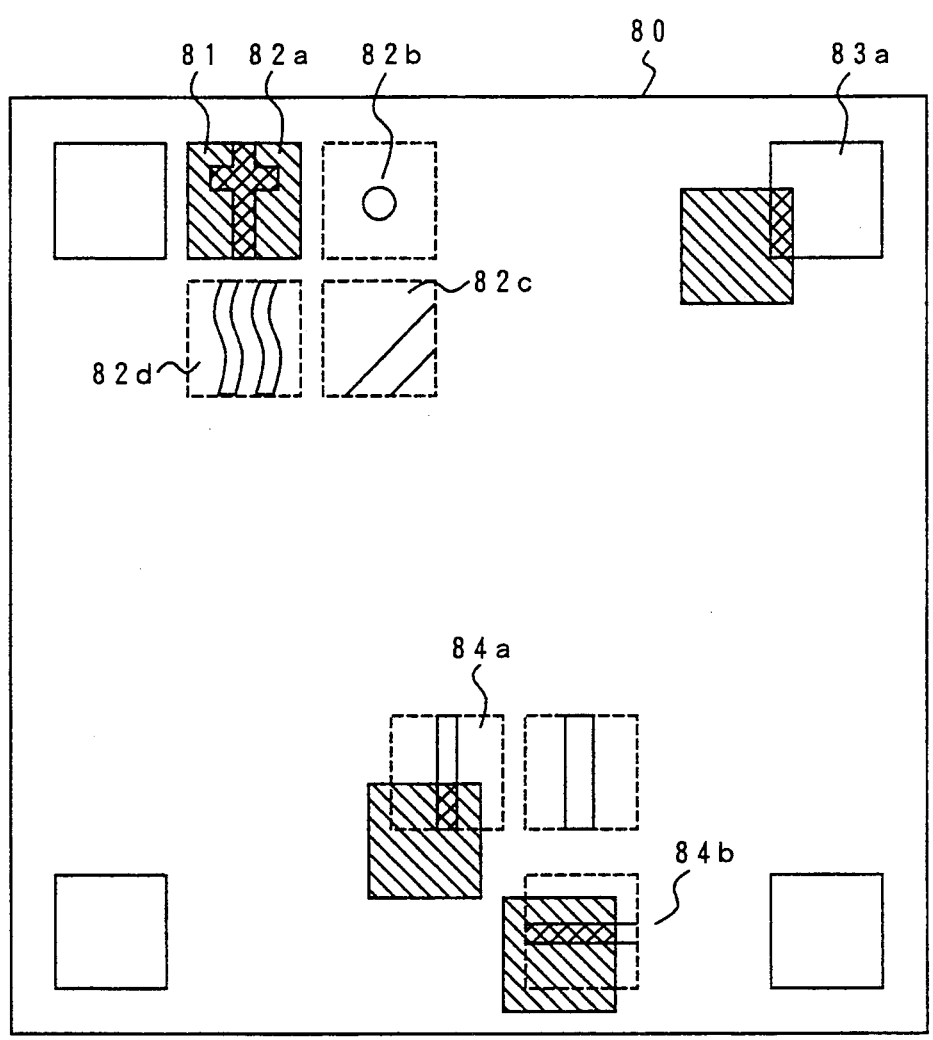
FIG. 11 is a diagram showing an example of the block mask that is produced and used in the process of FIG. 6.

FIG. 11 shows an example of the block mask that is fabricated in the step 12 of FIG. 6.

Figure 5:
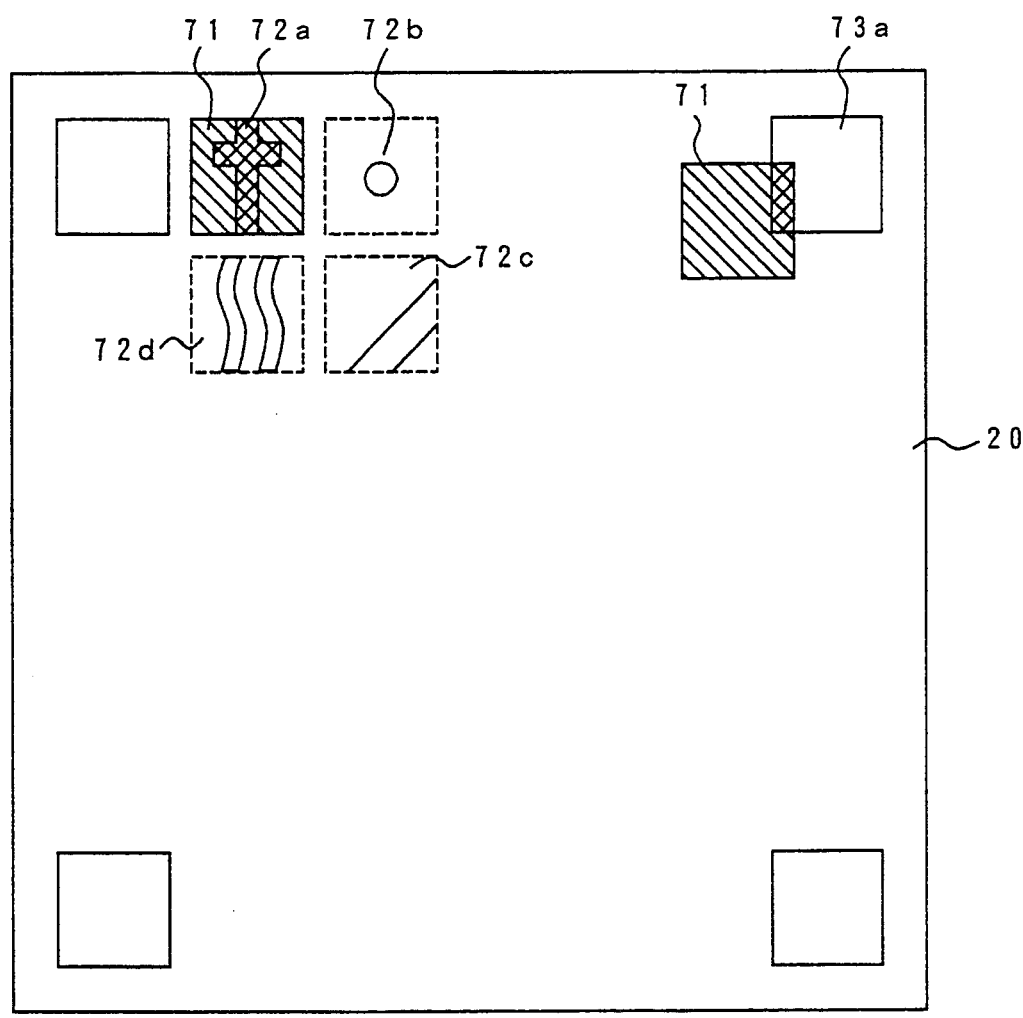
FIG. 5 is a diagram showing an example of shaping an electron beam by the apertures formed in the block mask.

Referring to FIG. 11, a block mask 80, thus fabricated and used in place of the mask 20 in the system of FIG. 1, has a construction similar to the block mask 20 of FIG. 5 in that the block mask 80 contains block patterns 82a–82d, corresponding to the block patterns 72a–72d of FIG. 5 and further, an aperture 83a is provided in corresponding to the aperture 73a for the variable beam shaping. On the other hand, a difference exists between the mask 80 and the mask 20 in the that the mask 80 is formed with apertures 84a, 84b, . . . for the variable line-length shaping of the electron beam. There, the apertures 82a–82d as well as the aperture 83a are used similarly to the conventional mask 20, while the aperture 84a or 84b is used to form an elongated rectangular beam with a variable line-length in the elongate direction. There, the deflection of the electron beam is controlled such that the overlap of the electron beam and the aperture is adjusted as illustrated in FIG. 9. As the electron beam is shaded by the two opposing major edges of the apertures, the shape of the elongated beam thus obtained is stable and a very precise beam pattern is projected on the surface of the substrate even when the width of the beam is smaller than 0.1 μm. Thus, the method of the present invention provides a powerful means for exposing very fine and critical patterns of semiconductor devices with a large throughput.

Figure 12:
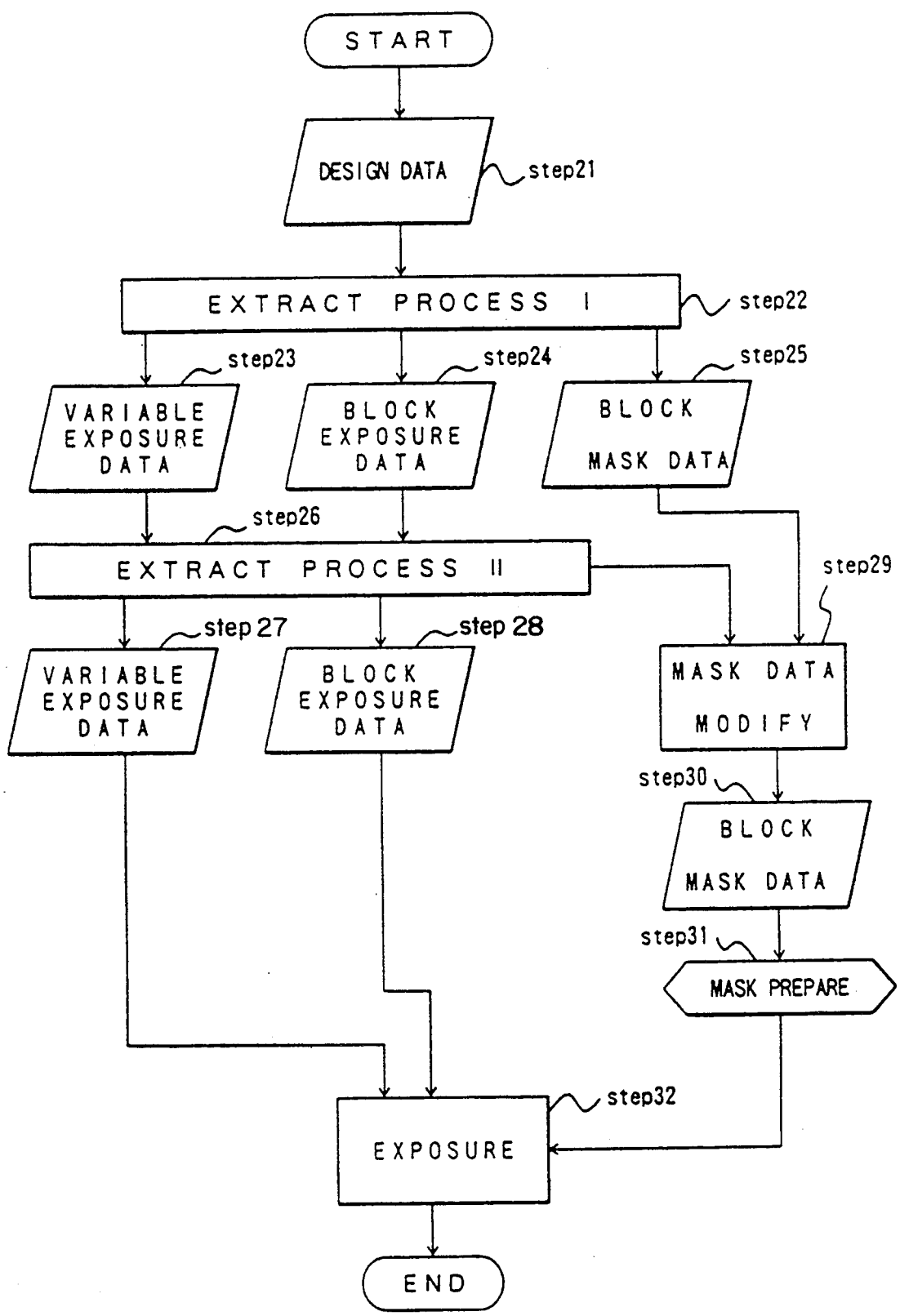
FIG. 12 is a flowchart showing the process for exposing a device pattern by the system of FIG. 1 according to a second embodiment of the present invention.

Next, a second embodiment of the present invention for improving the first embodiment will be described with reference to FIG. 12 showing a flowchart corresponding to FIG. 6.

Referring to FIG. 12, the process includes steps 21–25 respectively corresponding to the steps 1–5 of FIG. 6 for extracting the variable exposure data, the block exposure data and the block mask data. As the content of these steps are identical with those corresponding steps of FIG. 6, the description will be omitted.

In the present embodiment, the variable exposure data and the block exposure data thus extracted in the steps 23 and 24 are subjected to a second extracting process in a step 26, wherein block exposure data for fine lines having a width smaller than about 0.1 μm are extracted from the variable exposure data by examining the content, particularly of the third field (c), of the variable exposure data, and the data thus extracted are added to the block exposure data. Thereby, both the variable exposure data and the block exposure data are modified in steps 27 and 28 respectively. Further, the content of the mask data produced in the step 25 is modified based upon the newly extracted block exposure data in a step 29.

Based upon processing in the step 29, modified mask data is produced in a step 30 and the same is used for preparing a block mask such as the mask 80 in a step 31. Further, the exposure is achieved based upon the variable exposure data and the block exposure data in a step 32 while using the block mask prepared in the step 31.

Figure 13:
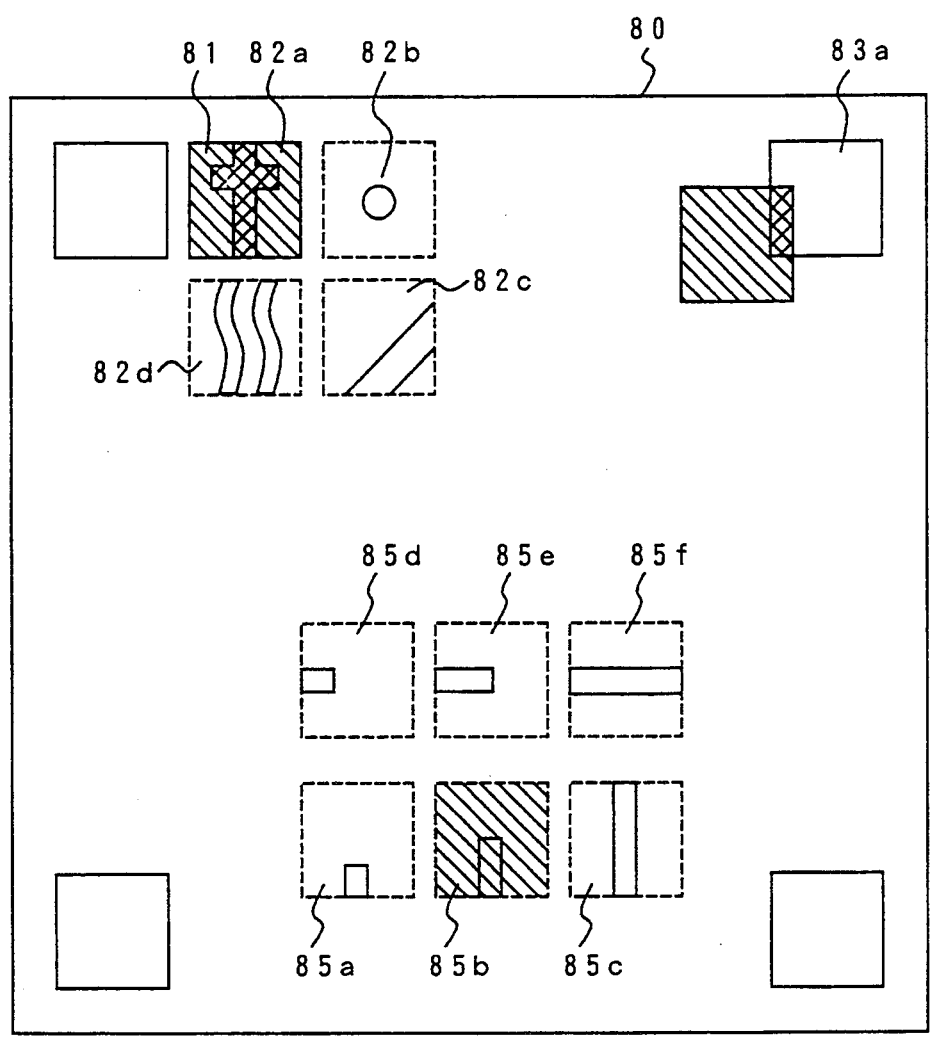
FIG. 13 is a diagram similar to FIG. 9 showing an example of the block mask that is produced in the process of FIG. 12.

FIG. 13 shows an example of the block apertures that are formed on the mask 80 as a result of the process of step 29. It will be noted that the mask is formed with apertures 85a–85f in addition to the conventional apertures 82a–82d and 83a, wherein each aperture has an elongated rectangular form with a width smaller than 0.1 μm in corresponding to the threshold width below which a satisfactory beam shaping is not possible by the conventional variable shaped beam exposure process.

It should be noted that the rectangular apertures 85a–85f may have various lengths. Further, these apertures may have several different widths depending on the block exposure data that is extracted in the step 26. By selectively addressing one of these apertures such as the aperture 85b as shown by hatching, the block exposure process can achieve those very fine line patterns. Thereby, not only the precision of the beam shape and hence the precision of the exposed pattern are improved but also the throughput of exposure is improved because of the increased tolerance in the beam deflection. In other words, one does not need precise control of the beam deflection to achieve the desired pattern by the variable beam shaping process. This advantage applies also to the first embodiment. On the other hand, the present embodiment is improved over the first embodiment in the point that one does not need variable beam shaping for setting the length of the exposed pattern.

In any of the foregoing processes of the first and second embodiments, and particularly in the process of the step 10 in the first embodiment or the step 29 in the second embodiment for modifying the mask data, it should be noted that the number of apertures that can be formed on the mask 80 is limited. For example, a typical pattern area such as the pattern area $E_1$ (see FIG. 3) on the mask may carry only 48 apertures, while the mask is already formed with apertures corresponding to the block exposure data extracted in the extracting process of the step 2 or the step 22. Thus, one has to set the number of the beam shaping apertures that are newly formed on the block mask to be smaller than the difference between the maximum number of the apertures possible to be formed on the mask and the number of the apertures that are already formed on the mask. On the other hand, there may be a large number of such block pattern data extracted in the step 26. In fact, any exposure pattern can be extracted as the block aperture. This problem is particularly serious in the second embodiment for extracting the fine block exposure data and corresponding mask data.

In order to solve this problem and to secure necessary block apertures on the mask 80, the process of the step 26 includes the steps shown in FIG. 14, wherein the exposure data for those patterns having a size difficult to expose by the conventional variable shaped beam exposure process are extracted in a first step 261 from the variable exposure data and classified subsequently according to the shape, size and the frequency of use of the exposure patterns. Next, the number of the block patterns that are formed already on the mask 80 is counted up in a step 262 for each of the pattern areas $E_i$ as designated by $N_{BLOCK}$, and a difference is calculated from the maximum number $N_{MAX}$ of the block patterns that can be provided in a single pattern area $E_i$ as designated by $N_{MAX} - N_{BLOCK}$ in a step 263. Further, a discrimination is made in the step 263 whether the difference $N_{MAX} - N_{BLOCK}$ is larger than zero or not. If the result is NO indicating that the pattern area $E_i$ is fully occupied by the block patterns arranged in rows and columns, there is no room for providing additional block patterns and the process is terminated. On the other hand, when the result is YES, a search is made in a step 264 for the pattern that has the smallest size and the same is converted subsequently to the block data in a step 265. Further, the value of the parameter $N_{BLOCK}$ is increased by one in a next step 266 and the data searched by the step 264 is deleted in a step 267 from the original variable exposure data. Further, a discrimination is made whether there is data to be processed next in a step 268 and if the result is YES, the process starting from the step 263 is repeated until the entire data contained in the variable exposure data is processed. Further, based upon the block exposure data thus modified, the mask data is modified in the process of the step 29 of FIG. 12.

Figure 14:
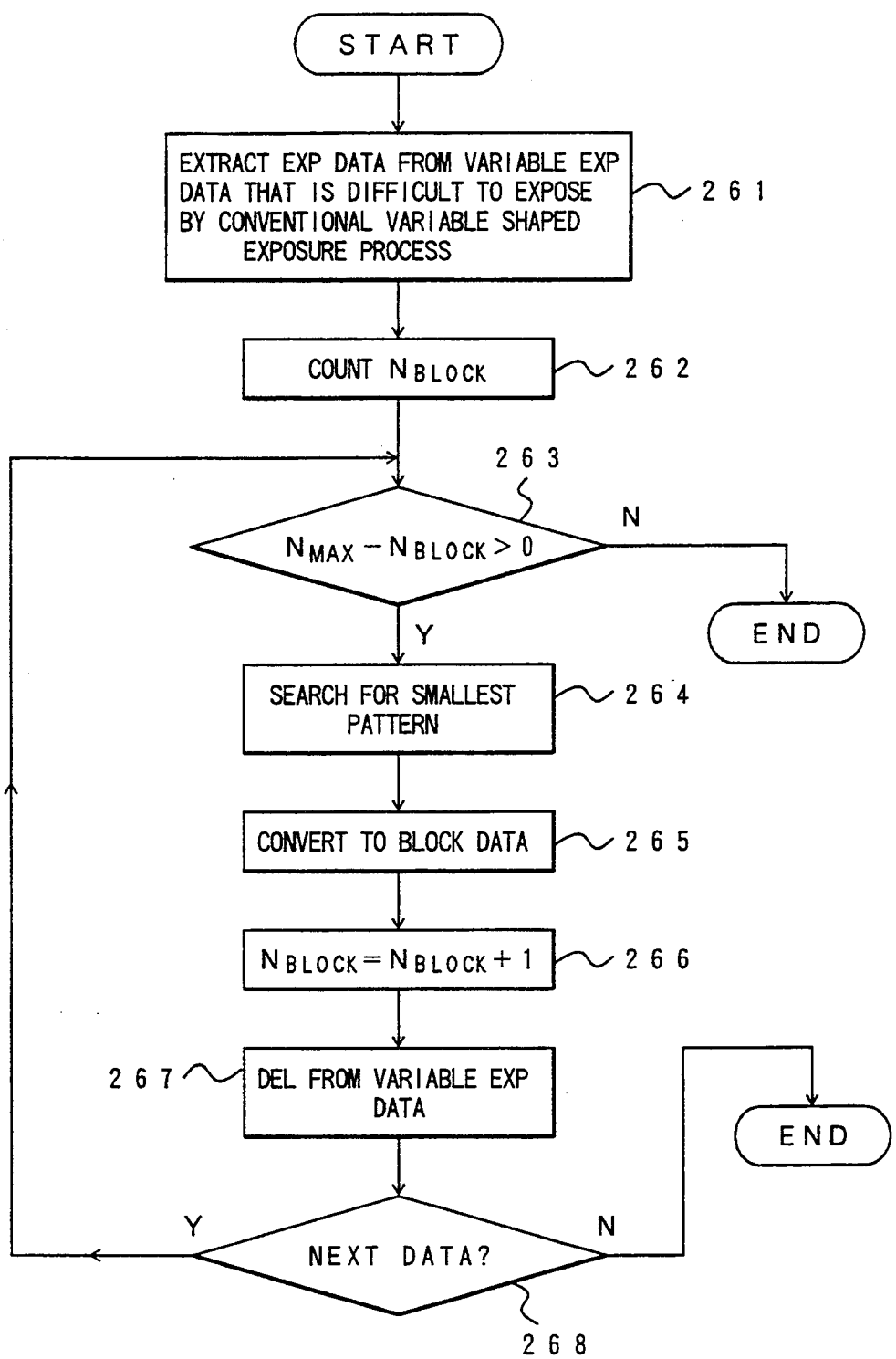
FIG. 14 is a flowchart showing a process for preparing a block mask that is used in the process of FIG. 12.

According to the process of FIG. 14, the exposure data for fine patterns are preferentially converted to the block exposure data, and the mask produced based upon the process of FIG. 14 contains thereon very fine slit patterns. Thereby, a precise beam shaping and hence exposure is achieved even when the exposed pattern has a very small size.

Figure 15:
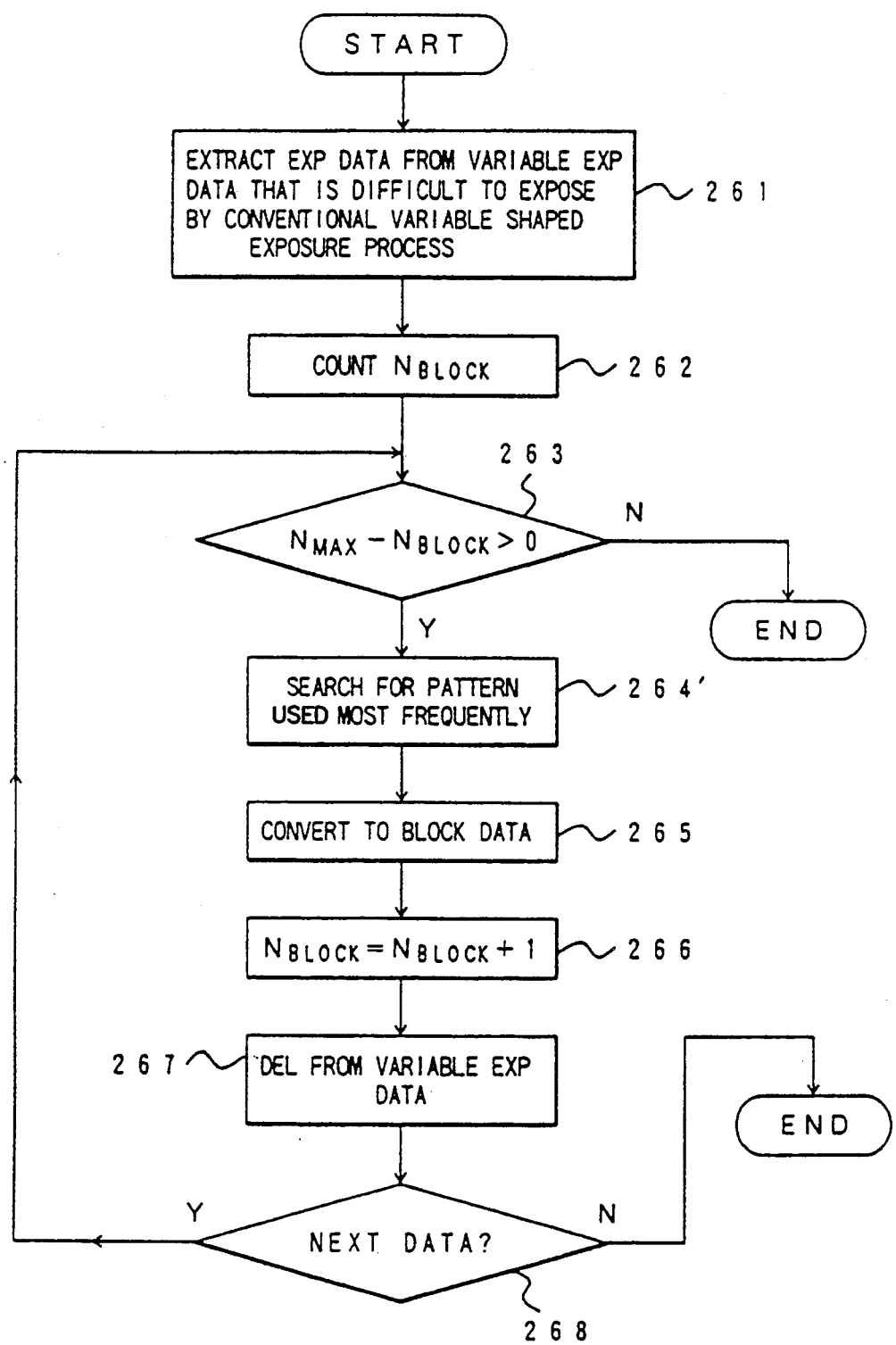
FIG. 15 is a flowchart showing another process for preparing a block mask that is used in the process of FIG. 12.

FIG. 15 shows another example for converting the variable exposure data to the block exposure data, wherein the process of FIG. 15 converts the exposure data for the patterns that are used most frequently. For this purpose, the content of the step 264 is modified as shown by a step 264'. As the rest of the process is identical with the process of FIG. 14, further description will be omitted.

Figure 16A:
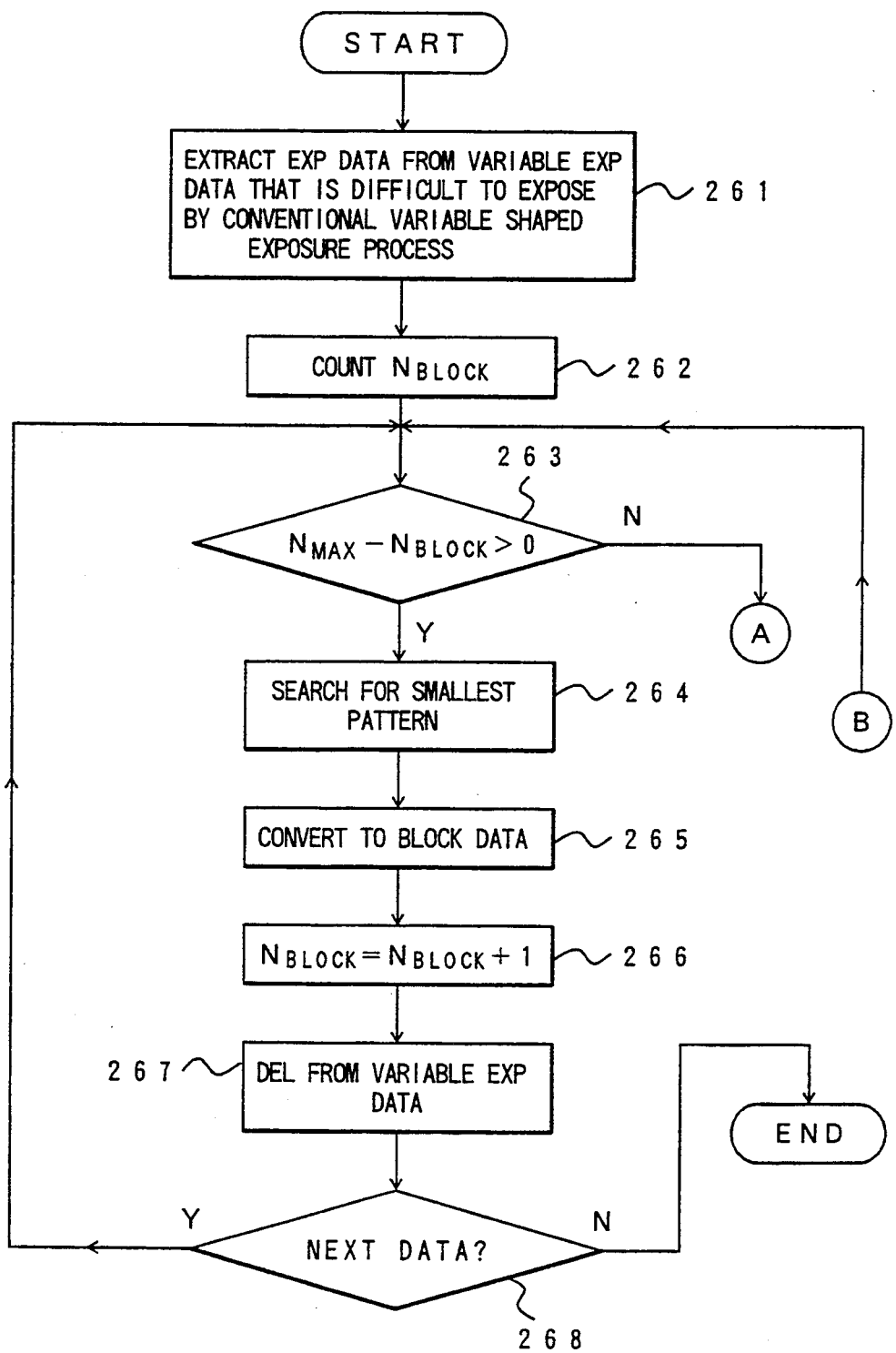
FIGS. 16(A) and 16(B) are flowcharts showing still other process for preparing a block mask that is used in the process of FIG. 12.
Figure 16B:
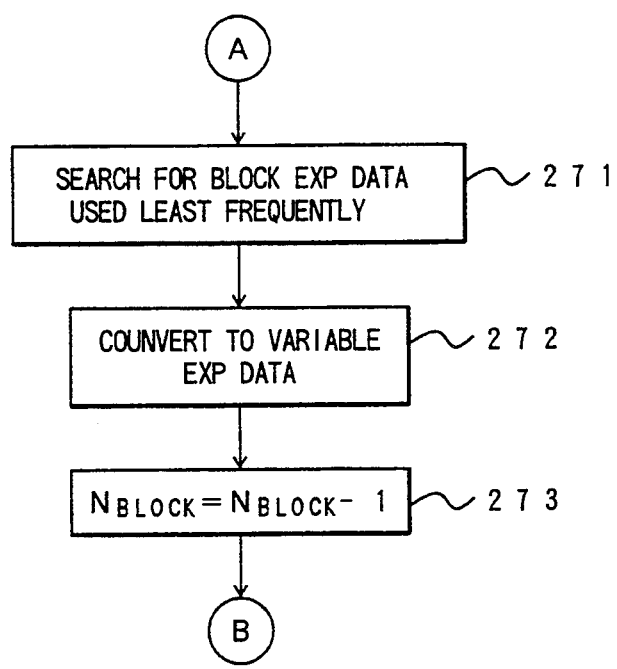

Further, FIGS. 16(A) and 16(B) shows a process that enables the conversion of the variable exposure data to the block exposure data even when there is no room for new shaping apertures on the mask 80.

In the present process, steps 271–273 are conducted when the result of discrimination in the step 263 is NO. More specifically, when the result of the step 263 is NO, a search is made in the step 271 for the block data and corresponding block pattern that is already formed on the mask 80 and is used least frequently. Next, the block data thus found are converted back to the variable exposure data in the step 272 and the block data is deleted from the mask data at the same time. Further, the parameter $N_{BLOCK}$ is reduced by one in the step 273. It will be noted that the process of FIGS. 16(A) and 16(B) makes room for a new block pattern on the mask 80 based upon the sacrifice of seldom used block patterns. Thereby, the exposure that has been achieved by using the deleted block patterns is now achieved by the variable shaped beam exposure process. In the trade off, one can achieve an exposure of very fine patterns by the block exposure process.

Further, the present invention is not limited to the embodiments described heretofore, but various variations and modifications may be made without departing from the scope of the invention.

What is claimed is:

1. A method for exposing, on an object, a device pattern comprising a plurality of different elemental patterns by selectively deflecting a beam of charged particles through a plurality of exposure apertures in a mask, the exposure apertures being of respective, different sizes and shapes corresponding to the plurality of different elemental patterns and being formed at respective, different locations in the mask, the beam being selectively deflected in accordance with design data representing the device pattern and the plurality of elemental patterns thereof and the design data further comprising mask data defining the plurality of apertures, the respective, different sizes and shapes thereof and the different locations thereof in the mask, said method comprising the steps of:

extracting, from said design data, block exposure data corresponding to and defining a set of selected elemental patterns of said plurality of elemental patterns, each selected elemental pattern corresponding to a block exposure aperture to be formed in the mask and through which the selectively deflected beam passes and is shaped, thereby to expose the corresponding elemental pattern on the object in accordance with the device pattern;

extracting, from said design data, variable exposure data corresponding to and defining the remaining elemental patterns, other than said set of selected elemental patterns, to be exposed on the object in accordance with the device pattern;

defining a minimum size threshold of the remaining elemental patterns;

separating said variable exposure data into fine exposure data corresponding to and defining fine elemental patterns having a size smaller than said minimum size threshold and coarse exposure data corresponding to and defining coarse elemental patterns having a size larger than said minimum size threshold, the fine elemental patterns corresponding to fine exposure apertures and the coarse elemental patterns corresponding to coarse exposure apertures to be formed in the mask and through which the selectively deflected beam passes thereby to expose the corresponding elemental pattern on the object in accordance with the device pattern, each coarse exposure aperture having two intersecting edges and the beam being selectively deflected for passing therethrough and for adjusting the extent of overlapping of the beam and the coarse exposure aperture, relatively to the respective two intersecting edges thereof, for shaping of the beam;

extracting, from said design data, mask data indicative of the locations, the sizes and the shapes, respectively, of the block exposure apertures, the coarse exposure apertures and the fine exposure apertures to be formed in said beam shaping mask, respectively corresponding to, and to be used shaping said beam of charged particles thereby to expose, the selected elemental patterns, the coarse elemental patterns and the fine elemental patterns;

fabricating the beam shaping mask including forming at the respective locations therein, said block exposure apertures, said coarse exposure apertures and said fine exposure apertures of the respective sizes and shapes thereof, based upon said extracted mask data; and exposing said device pattern on the object by selectively passing said beam through said block exposure apertures, said coarse exposure apertures and said fine exposure apertures, based upon said corresponding and extracted block exposure data, coarse exposure data and fine exposure data, respectively, and said corresponding and extracted mask data indicating the respective locations thereof.

2. The method as claimed in claim 1, wherein said step of separating said variable exposure data further comprises:

making a determination whether there is space for a new aperture on the beam shaping masks;

searching said fine exposure data for fine elemental patterns based on a given parameter if said determination is positive;

deleting said fine exposure data from said variable exposure data after said fine exposure data is searched for said fine elemental patterns.

3. The method as claimed in claim 1, wherein said step of separating variable exposure data comprises a step of extracting said fine exposure data corresponding to and defining fine elemental patterns, each of said fine elemental patterns having a minimum dimension smaller than about 0.1 μm.

4. The method as claimed in claim 3, wherein:

said step of extracting mask data further comprises a step of extracting the mask data that specifies an elongated aperture defined by a pair of mutually opposing major edges separated from each other by a distance less than 0.1 μm, said elongated aperture being one of said fine exposure apertures; and said step of exposing said device pattern comprises a step of deflecting said beam, based upon said fine exposure data, such that said beam is shaped by at least said pair of mutually opposing major edges of said elongated aperture to form an elongated beam.

5. The method as claimed in claim 4, wherein said step of deflecting said beam generates said elongated beam having a variable length that is determined by said fine exposure data.

6. The method as claimed in claim 1, wherein said fine exposure data corresponds to and defines a plurality of fine elemental patterns with respective minimum dimensions smaller than about 0.1 µm.

7. The method as claimed in claim 1, wherein said step of separating said variable exposure data comprises a step of extracting the fine exposure data corresponding to and defining ones of said fine elemental patterns that are to be exposed on the object a plurality of times.

8. The method as claimed in claim 7, wherein said step of separating said variable exposure data comprises the step of extracting said fine exposure data corresponding to and defining a plurality of different fine elemental patterns which are fewer than a difference between a maximum number of apertures that can be formed on said beam shaping mask and a number of the apertures that are already formed in said beam shaping mask, based upon said design data.

9. The method as claimed in claim 8, wherein said step of extracting the fine exposure data corresponding to and defining the plurality of different fine elemental patterns further comprises the step of searching the fine exposure data corresponding to and defining the fine elemental patterns based upon increasing sizes of the respective fine elemental patterns.

10. The method as claimed in claim 8, wherein said step of extracting the fine exposure data corresponding to and defining the plurality of different fine elemental patterns further comprises the step of searching the fine exposure data corresponding to and defining the fine elemental patterns based upon decreasing frequencies of use of the respective fine elemental patterns.

11. The method as claimed in claim 8, wherein said step of extracting the fine exposure data corresponding to and defining the plurality of different fine elemental patterns further comprises the steps of:
converting said fine exposure data indicating the smallest fine elemental pattern to block exposure data when said difference is zero;
deleting the fine exposure data that has been extracted in said step of converting said fine exposure data when said difference is zero, wherein an area is secured on the beam shaping mask for a new fine exposure aperture that corresponds to said converted fine exposure data.

12. The method as claimed in claim 11, wherein said step of deleting said fine exposure data is based upon searching for the fine exposure data corresponding to and defining the elemental pattern having increasing respective frequencies of use.

13. A method for exposing a device pattern on an object by selectively deflecting a beam of charged particles through apertures of a beam shaping mask, based upon design data that represents said device pattern to be exposed, said device pattern comprising a plurality of elemental patterns, said method comprising the steps of:
defining a minimum size threshold of said plurality of elemental patterns corresponding to and defined by said design data;
extracting, from the design data, fine exposure data comprising exposure data corresponding to and defining fine elemental patterns having a size smaller than said minimum size threshold;
extracting, from the design data, mask data indicative of a plurality of apertures including an elongated aperture having a width smaller than said minimum size threshold;
fabricating the beam shaping mask with the elongated aperture having the width smaller than said minimum size threshold, based on the mask data; and
directing said beam at two intersecting edges of said elongated aperture formed in said beam shaping mask in accordance with the fine exposure data such that said beam passes through said elongated aperture, said beam being shaped by two opposing edges that form said elongated aperture in order for said beam to have an elongated cross section extending along said elongated aperture with a variable length.

14. A method of fabricating a mask used in exposing a device pattern on an object by passing a beam of charged particles through the mask based upon design data, the design data defining the device pattern in accordance with a plurality of elemental patterns and comprising plural elemental pattern design data defining respective, plural elemental patterns of different respective configurations and sizes and mask data defining the location and size in the device pattern of each of the elemental patterns and the number of times each elemental pattern is used in the design pattern, the method comprising:
defining a first threshold relative to the number of times each elemental pattern is used in the device pattern, each elemental pattern which exceeds the first threshold being designated as a block elemental pattern and each elemental pattern which does not exceed the first threshold being designated as a variable elemental pattern;
defining a second threshold relative to the range of respective sizes of each elemental pattern;
extracting, from the design data, block elemental pattern design data defining the block elemental patterns;
extracting, from the design data, variable elemental pattern design data defining the variable elemental patterns which exceed the second threshold;
extracting, from the design data, the variable elemental pattern design data defining the variable elemental patterns which do not exceed the second threshold;
extracting, from the design data, the mask data defining the location in the device pattern of each of the elemental patterns in the device pattern and the number of times each elemental pattern is used; and
fabricating a mask in accordance with:
forming an individual block elemental pattern aperture respectively corresponding to each block elemental pattern defined by said extracted block elemental pattern design data at a location on the mask designated by the mask data,
forming an aperture in the mask having first and second transverse dimensions each of which exceeds the corresponding first and second transverse dimensions of the variable elemental patterns which exceed the second threshold, and
for each variable elemental pattern which does not exceed the second threshold, forming a corresponding aperture in which the smaller of the first and second dimensions is the same as the smaller dimension of the variable elemental pattern which does not exceed the second threshold.

15. A method of forming a mask to be used for exposing, on an object, a device pattern comprising a plurality of different elemental patterns by selectively deflecting a beam of charged particles through a plurality of exposure apertures in the mask, the exposure apertures being of respective, different sizes and shapes corresponding to the plurality of different elemental patterns and being formed at respective, different locations in the mask, the beam being selectively deflected in accordance with design data representing the device pattern and the plurality of elemental patterns thereof and the design data further comprising mask data defining the plurality of apertures, the respective, different sizes and shapes thereof and the different locations thereof in the mask, said method comprising the steps of:

extracting, from said design data, block exposure data corresponding to and defining a set of selected elemental patterns of said plurality of elemental patterns, each selected elemental pattern corresponding to a block exposure aperture to be formed in the mask and through which the selectively deflected beam passes and is shaped, thereby to expose the corresponding elemental pattern on the object in accordance with the device pattern;

extracting, from said design data, variable exposure data corresponding to and defining the remaining elemental patterns, other than said set of selected elemental patterns, to be exposed on the object in accordance with the device pattern;

defining a minimum size threshold of the remaining elemental patterns;

separating said variable exposure data into fine exposure data corresponding to and defining fine elemental patterns having a size smaller than said minimum size threshold and coarse exposure data corresponding to and defining coarse elemental patterns having a size larger than said minimum size threshold, the fine elemental patterns corresponding to fine exposure apertures and the coarse elemental patterns corresponding to coarse exposure apertures to be formed in the mask and through which the selectively deflected beam passes thereby to expose the corresponding elemental pattern on the object in accordance with the device pattern, each coarse exposure aperture having two intersecting edges and the beam being selectively deflected for passing therethrough and for adjusting the extent of overlapping of the beam and the coarse exposure aperture, relatively to the respective two intersecting edges thereof, for shaping of the beam;

extracting, from said design data, mask data indicative of the locations, the sizes and the shapes, respectively, of the block exposure apertures, the coarse exposure apertures and the fine exposure apertures to be formed in said beam shaping mask, respectively corresponding to, and to be used for shaping said beam of charged particles thereby to expose, the selected elemental patterns, the coarse elemental patterns and the fine elemental patterns; and fabricating the beam shaping mask, including forming at the respective locations therein, said block exposure apertures, said coarse exposure apertures and said fine exposure apertures of the respective sizes and shapes thereof, based upon said extracted mask data.

16. A method for exposing, on an object, a device pattern comprising a plurality of different elemental patterns by selectively deflecting a beam of charged particles through a plurality of exposure apertures in a mask, the exposure apertures being of respective, different sizes and shapes corresponding to the plurality of different elemental patterns and being formed at respective, different locations in the mask, the beam being selectively deflected in accordance with design data representing the device pattern and the plurality of elemental patterns thereof and the design data further comprising mask data defining the plurality of apertures, the respective, different sizes and shapes thereof and the different locations thereof in the mask, said method comprising the steps of:

processing the design data in accordance with the steps of:

extracting, from said design data, block exposure data corresponding to and defining a set of selected elemental patterns of said plurality of elemental patterns, each selected elemental pattern corresponding to a block exposure aperture to be formed in the mask and through which the selectively deflected beam passes and is shaped, thereby to expose the corresponding elemental pattern on the object in accordance with the device pattern, extracting, from said design data, variable exposure data corresponding to and defining the remaining elemental patterns, other than said set of selected elemental patterns, to be exposed on the object in accordance with the device pattern.

defining a minimum size threshold of the remaining elemental patterns, separating said variable exposure data into fine exposure data corresponding to and defining fine elemental patterns having a size smaller than said minimum size threshold and coarse exposure data corresponding to and defining coarse elemental patterns having a size larger than said minimum size threshold, the fine elemental patterns corresponding to fine exposure apertures and the coarse elemental patterns corresponding to coarse exposure apertures to be formed in the mask and through which the selectively deflected beam passes thereby to expose the corresponding elemental pattern on the object in accordance with the device pattern, each coarse exposure aperture having two intersecting edges and the beam being selectively deflected for passing therethrough and for adjusting the extent of overlapping of the beam and the coarse exposure aperture, relatively to the respective two intersecting edges thereof, for shaping of the beam, and extracting, from said design data, mask data indicative of the locations, the sizes and the shapes, respectively, of the block exposure apertures, the coarse exposure apertures and the fine exposure apertures to be formed in said beam shaping mask, respectively corresponding to, and to be used for shaping said beam of charged particles thereby to expose, the selected elemental patterns, the coarse elemental patterns and the fine elemental patterns; and fabricating the beam shaping mask, including forming at the respective locations therein, said block exposure apertures, said coarse exposure apertures and said fine exposure apertures of the respective sizes and shapes thereof, based upon said extracted mask data; and exposing said device pattern on the object by selectively passing said beam through said block exposure apertures, said coarse exposure apertures and said fine exposure apertures, based upon said corresponding and extracted block exposure data, coarse exposure data and fine exposure data, respectively, and said corresponding and extracted mask data indicating the respective locations thereof.

* * * * *

UNITED STATES PATENT AND TRADEMARK OFFICE
CERTIFICATE OF CORRECTION

PATENT NO. : 5,349,197
DATED : September 20, 1994
INVENTOR(S) : Kiichi SAKAMOTO et al.

It is certified that error appears in the above-indentified patent and that said Letters Patent is hereby corrected as shown below:

Title page, [57] Abstract, lines 2 and 7, "comprises" should be --includes--.

Column 1,      line 7, after "particularly" insert --,--;

line 39, "hit" should be --selectively pass through--;

line 41, after "and" insert --thereby expose a--;

line 42, delete "is".

Column 2,      line 12, delete "that";

line 13, delete "," and after "thereto" insert --, such--;

line 14, delete "such".

Column 5,      line 16, after "low" and "hence" insert --,--;

line 17, "the" (third occurrence) should be --a--;

line 23, after "of" (first occurrence) insert --a--;

line 51, "deposition" should be --deposit--.

Column 7,      line 42, delete "," and after "device" insert --,--;

line 43, after "FIG. 1" insert --,--;

line 53, after "FIG. 7" insert --,--;

line 58, after "data" insert --,--.

UNITED STATES PATENT AND TRADEMARK OFFICE
CERTIFICATE OF CORRECTION

PATENT NO. : 5,349,197
DATED : September 20, 1994
INVENTOR(S) : Kiichi SAKAMOTO et al.

It is certified that error appears in the above-indentified patent and that said Letters Patent is hereby corrected as shown below:

| | |
|---|---|
| Column 8, | line 31, after "block" insert --,--. |
| Column 9, | line 39, after "length" insert --,--. |
| Column 10, | line 30, after "widths" insert --,--; |
| | line 54, "in" should be --,--; |
| | line 65, "to" should be --as in--. |
| Column 11, | line 3, "shaded" should be --shaped--; |
| | line 4, "apertures" should be --aperture--; |
| | line 32, after "28" insert --,--; |
| | line 56, after "85b" insert --,--; |
| | line 67, "point" should be --fact--. |
| Column 12, | line 36, after "$E_i$" insert --,--; |
| | line 40, after "NO" insert --,--; |
| | line 62, after "and" and "hence" insert --,--. |

UNITED STATES PATENT AND TRADEMARK OFFICE
CERTIFICATE OF CORRECTION

PATENT NO. : 5,349,197

DATED : September 20, 1994

INVENTOR(S) : Kiichi SAKAMOTO et al.

It is certified that error appears in the above-indentified patent and that said Letters Patent is hereby corrected as shown below:

Column 14, line 20, after "used" insert --for--;

line 42, "masks" should be --mask--.

Signed and Sealed this

Seventeenth Day of January, 1995

Attest:

BRUCE LEHMAN

Attesting Officer      Commissioner of Patents and Trademarks